United States Patent [19]
Cline

[11] 3,867,644
[45] Feb. 18, 1975

[54] HIGH SPEED LOW POWER SCHOTTKY INTEGRATED LOGIC GATE CIRCUIT WITH CURRENT BOOST

[75] Inventor: Ronald L. Cline, San Jose, Calif.

[73] Assignee: Signetics Corporation, Sunnyvale, Calif.

[22] Filed: Jan. 7, 1974

[21] Appl. No.: 431,043

[52] U.S. Cl. .................. 307/213, 307/215, 307/310, 307/317 A

[51] Int. Cl. ...................... H03k 19/08, H03k 19/36

[58] Field of Search ........... 307/203, 213, 214, 215, 307/218, 317 A, 310

[56] References Cited

UNITED STATES PATENTS

| | | | |
|---|---|---|---|
| 3,439,186 | 4/1969 | Seelbach | 307/215 X |
| 3,491,251 | 1/1970 | Witsell | 307/215 |
| 3,555,294 | 1/1971 | Treadway | 307/215 X |
| 3,560,761 | 2/1971 | Kardash | 307/215 |
| 3,790,817 | 2/1974 | Dobkin | 307/215 |

*Primary Examiner*—John Zazworsky
*Attorney, Agent, or Firm*—Flehr, Hohbach, Test, Albritton & Herbert

[57] ABSTRACT

A high speed low power Schottky integrated logic gate circuit of a quadruple two input NAND gate type provides an adequate input voltage threshold even under increasing ambient temperatures by providing an additional transistor $V_{be}$ drop to the existing $2V_{be}$ voltage drop circuit but yet maintains the high speed of the circuit by use of an additional current boosting transistor.

3 Claims, 7 Drawing Figures

HIGH SPEED LOW POWER SCHOTTKY INTEGRATED LOGIC GATE CIRCUIT WITH CURRENT BOOST

BACKGROUND OF THE INVENTION

The present invention is directed to a high speed low power Schottky integrated logic gate circuit with current boost.

As illustrated in FIG. 1, Texas Instruments Corporation produces a quadruple two input NAND gate having Schottky transistors under the model designation 74LSOO. The circuit is a relatively high speed low power logic gate. The input at terminal 10 is coupled through a Schottky diode D1 to the base input of Schottky transistor Q4 which functions as a phase splitter. The output at terminal 11 is taken between transistors Q6 and Q7 which are connected in a totem pole arrangement with the transistor Q8 providing a Darlington configuration. Schottky transistor Q5 is an active pull down transistor for Q6. A Schottky diode D3 is coupled between the base input of Q7 and the collector of Q4. FIG. 1A illustrates the relationship of the input and output waveforms a high input, of for example 3 volts, producing a low output of 0 volts.

The threshold voltage of input terminal 10 is determined by the sum of the $V_{be}$ drops of first and second Schottky transistors Q4 and Q6 which are connected in a cascade arrangement, and by diode D1 which provides a voltage drop in the opposite sense. Thus, assuming at normal temperatures a 0.7 volt drop for each transistor a total drop across transistors Q4 and Q6 is 1.4 volts which when substracted from the typical 0.4 volt drop of D1 provides an input threshold, $V_{TH}$, of one volt. However, at higher temperatures of, for example, 125°C. the $V_{be}$ of the transistor might be 0.5 volt and that of D1, 0.3, to provide a threshold only 0.7 volts. Such reduction in threshold voltage makes the circuit much more susceptible to false triggering due to noise.

OBJECTS AND SUMMARY OF THE INVENTION

It is, therefore, an object of the present invention to provide a high speed low power Schottky integrated logic gate circuit which has a high input threshold voltage under high ambient temperatures while maintaining its high speed.

In accordance with the above object there is provided a high speed low power Schottky integrated logic gate circuit having between input and common a $2V_{be}$ transistor voltage drop produced by first and second cascaded Schottky transistors and by an opposite diode voltage drop produced by diode means coupled to the input. The voltage drops determine the threshold input voltage level, $V_{TH}$, where switching occurs. An increase in ambient temperature tends to reduce these voltage drops and $V_{TH}$ whereby the circuit is more susceptible to noise. A third transistor is coupled to the first transistor in a sense to add to said $V_{be}$ of the first transistor to raise $V_{TH}$. The third transistor has its control terminal coupled to the diode means. Pull out resistor means are connected to the first transistor for pulling out the first transistor. Current boost transistor means are connected between the third transistor and a d.c. voltage source for providing a low impedance high current path for charging associated parasitic capacitances.

DETAILED DESCRIPTION OF THE PREFERRED EMBODIMENT

Figure 1:
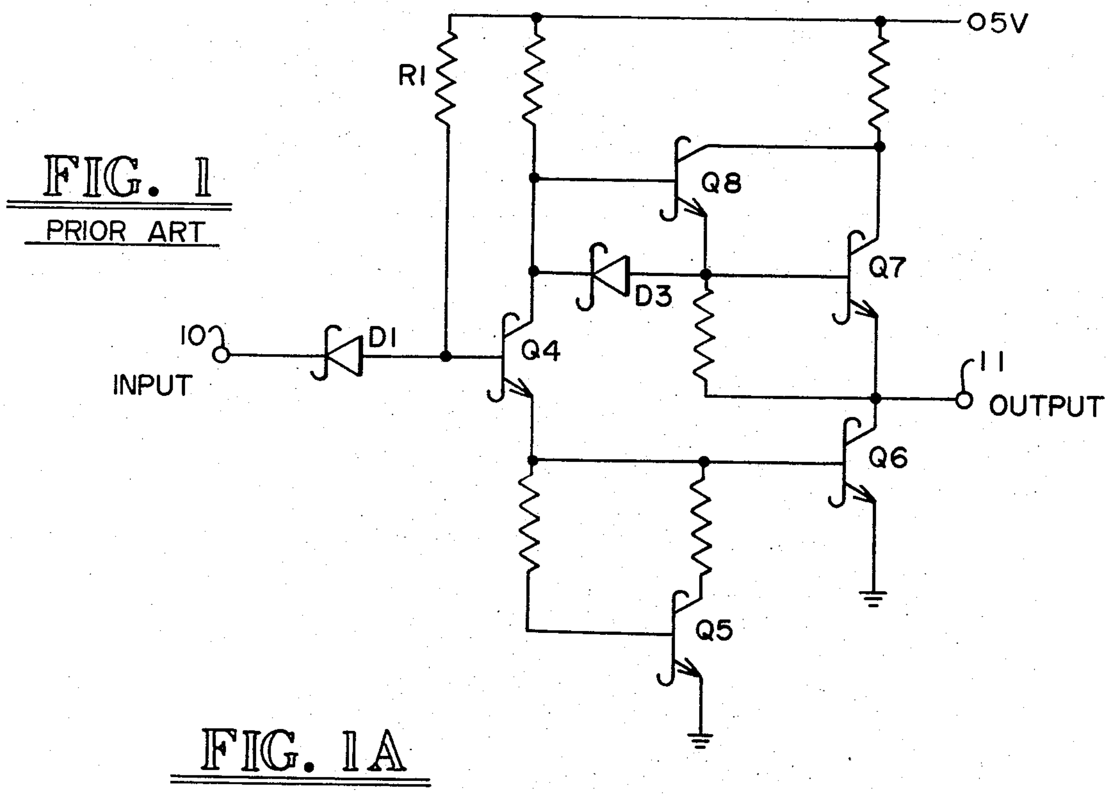
FIG. 1 PRIOR ART
FIG. 1 is a circuit schematic of a prior art circuit.
Figure 1A:
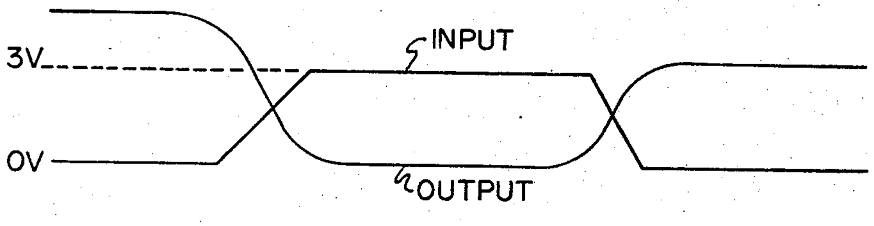
FIG. 1A shows typical input and output waveforms for FIG. 1.

The circuit of FIG. 1 has already been referred to. However, its transistor designations will be used for equivalent transistors in subsequent descriptions. Specifically, referring to FIG. 2 a solution to the low threshold voltage problem of the circuit of FIG. 1 is suggested by the DTL approach of FIG. 2 using standard diodes. Specifically, the diode D2 is provided between the input terminal 10 and their associated input diodes D1A and D1B and the base input of Q4. This is connected in an opposite sense so that the diode drop D2 cancels out the diode drop D1. Thus, the threshold voltage is determined solely by the $V_{be}$ drops of transistors Q4 and Q6. At a normal temperature of 25°C. the sum of these drop 1.4 volts and at 125°C., 1.0 volts. This is a desirable threshold voltage at this higher ambient temperature. However, the circuit of FIG. 2 has the disadvantage of being much too slow in operation or in other words, having too slow a rise time for practical use. Specifically, the diodes D1 and D2 act as a pair of capacitors which in combination with the resistor R1 cause a rise time of substantially 25 nanoseconds. The rise time is also due in part to the pull down transistor resistor R2 connected between the base and emitter of Q4 which must be provided to allow Q4 to to be pulled down in view of the path being blocked by the diode D2. In other words, R2 has an inherent capacitance C2 which also must be charged.

Figure 2:
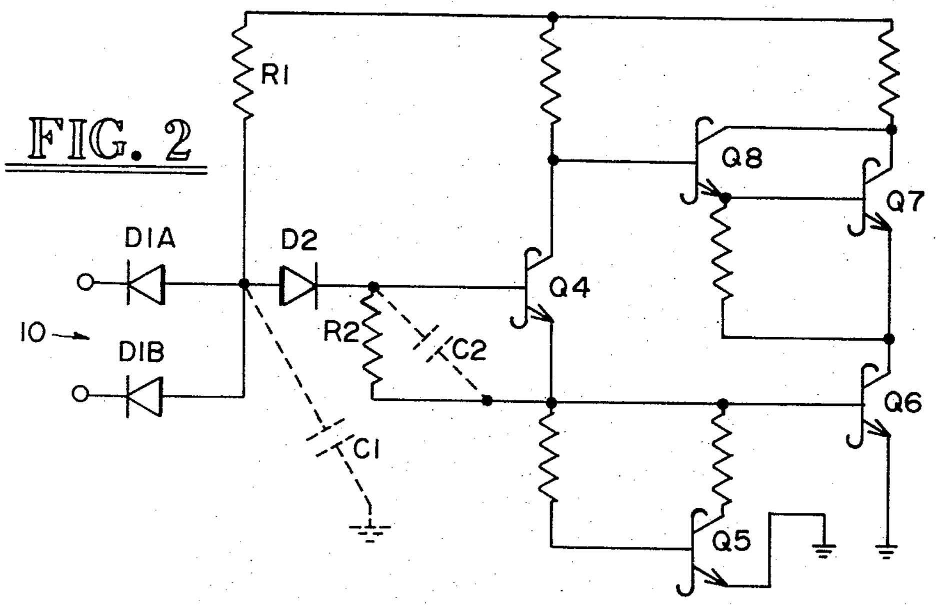
FIG. 2 is a circuit schematic of a modification of FIG. 1.
Figure 2A:
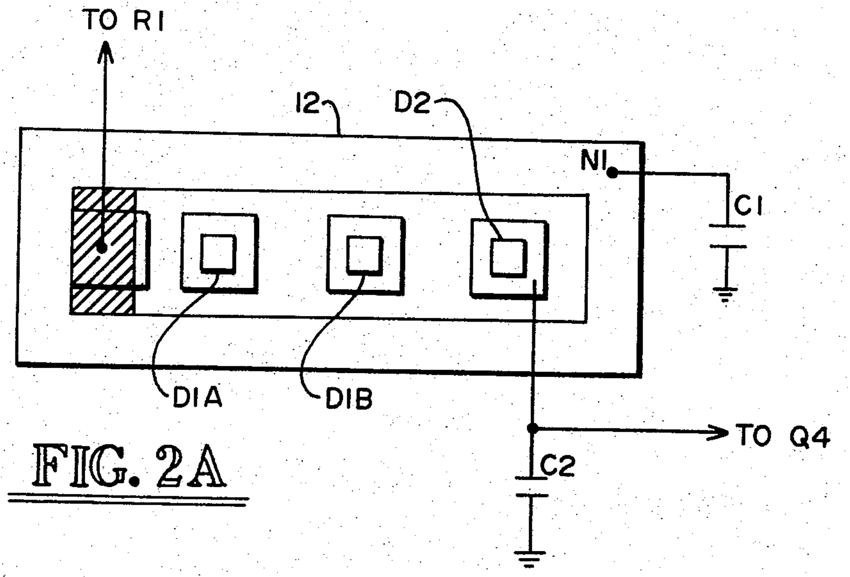
FIG. 2A is a simplified partial plan view of an integrated circuit of FIG. 2.

A typical integrated circuit of FIG. 2 is shown in FIG. 2A which shows in a single tub structure with diffusion or dielectric isolation structure 12, D1A, D1B, and D2 with the appropriate circuit connections. The tub produces a relatively large capacitance to ground C1 of 0.6 picofarads and in addition, the base emitter capacitance of Q4 is shown as C2. This is in part due to the parasitic capacitance of Q4 and the pull down resistor R2.

Thus, although the reverse diode approach of FIG. 2 tends to raise the threshold voltage it suffers from the disadvantage of excessive time delays due to the increased capacitance effect.

Figure 3:
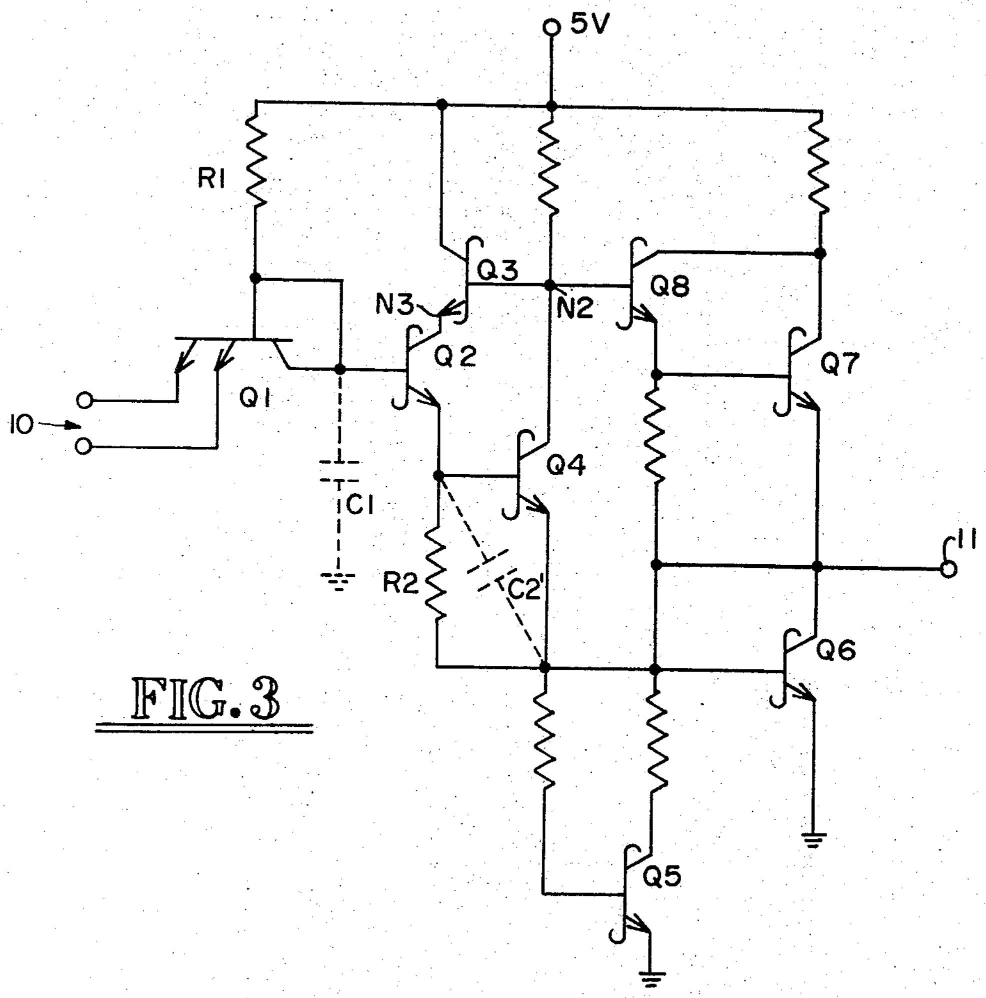
FIG. 3 is a circuit schematic embodying the present invention.

In accordance with the present invention, the circuit of FIG. 3 solves the foregoing capacitance problem. A current boost Schottky transistor Q2 is provided which has its emitter coupled to the base input of Q4 and to the pull down resistor R2. Several inputs 10 are provided by the diode connected transistor Q1 which has its collector coupled to the base input of Q2. The base emitter voltage drop of Q2 is in a sense so that it adds to the base emitter voltage drops of Q4 and Q6. Thus, the diode drop of Q1 is canceled out and a higher threshold voltage provided even at the higher temperatures.

However, connected to the collector of Schottky transistor Q2 is the emitter of a current boost transistor Q3 which has its collector coupled to the 5 volt d.c. voltage source and its base input to the collector of Q4. Q3 provides a low impedance high current path for charging the associated parasitic capacitance associated with the base to emitter of transistor Q4 designated C2'.

Figure 3A:
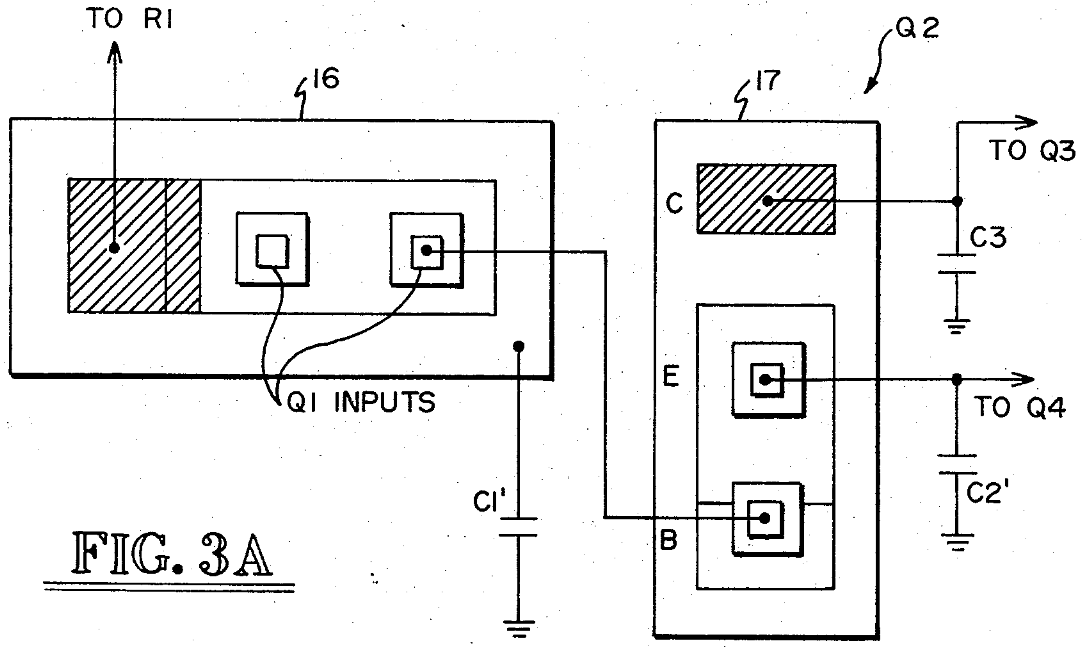
FIG. 3A is a simplified partial plan view of an integrated circuit of FIG. 3.

As illustrated in FIG. 3A, transistor Q2 is also in a separate integrated circuit isolation tub as opposed to transistor connected diode Q1. Specifically, tub 16 contains transistor Q1 which has a capacitance C1' of, for example approximately 0.4 picofarads, and tub 17 contains transistor Q2 with a tub capacitance of C3 and has its emitter terminal coupled to Q4 whose parasitic capacitance is shown as C2'.

In general, the tub 16 has a smaller capacitance since it is a two emitter tub versus a three emitter tub of FIG. 2A. In addition, from a circuit standpoint and referring also to the circuit of FIG. 3, transistor Q3 pulls up the tub 17 toward the d.c. voltage source level to reduce the effects of tub capacitance C3. Specifically, with the output 11 is high meaning that the input 10 is low, node N2 at the bases of Q3 and Q8 is at approximately 5 volts and node N3 at the collector of Q2 is at 4.3 volts. At this point, Q2 is pulled up almost to the d.c. voltage source except for the base emitter voltage drop of Q3. This is as opposed to the structure of FIGS. 2 and 2A where the diode is essentially floating.

Continuing the operation of FIG. 3, when the input at terminal 10 goes up Q2 turns on to pull N3 down. Q3 is turned on because of its common base configuration. Turning on Q3 provides a low impedance high current path through Q3 to the d.c. voltage source of 200 to 500 microamperes extra to allow Q2 to effectively charge up the base emitter capacitance C2' of Q4 a portion of which includes the pull out resistor R2. Thus, transistor Q3 provides the necessary current boost for fast switching. After Q4 is completely turned on, Q3 is cut off. Q3 is then inoperative during the opposite transition except to charge up the collector capacitance of Q2; in other words, to pull up the level of Q2.

Figure 4:
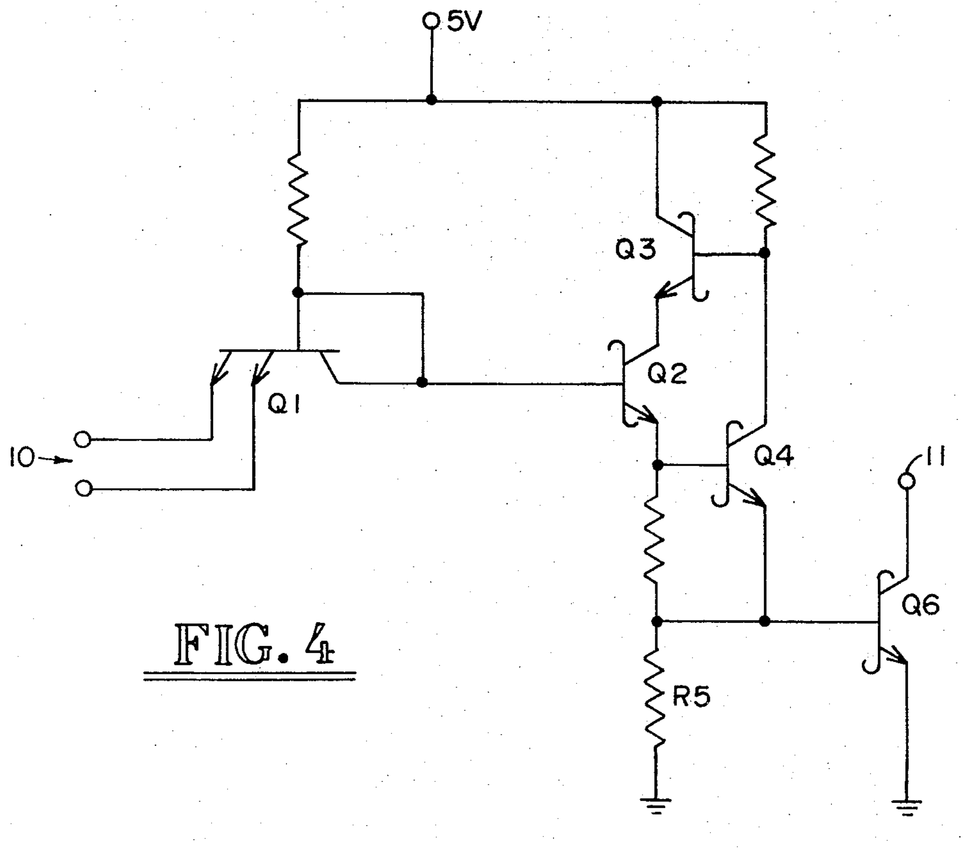
FIG. 4 is a circuit schematic of another embodiment of the present invention.

FIG. 4 illustrates a second embodiment of the invention which instead of the totem pole output is of an open collector configuration. It functions in the same manner as the totem pole arrangement of FIG. 3 except that the active pull down transistor Q5 has been replaced by a passive resistor R5.

Thus, an improved high speed low power Schottky integrated logic gate circuit has been provided which under high ambient temperatures still has as sufficient threshold voltage.

I claim:

1. In a high speed low power Schottky integrated logic gate circuit having between input and common a $2V_{be}$ transistor voltage drop produced by first and second cascaded Schottky transistors and an opposite diode voltage drop produced by diode means coupled to said input, said voltage drops determining the threshold input voltage level, $V_{TH}$, at which switching occurs, an increase in ambient temperature tending to reduce said voltage drops and to reduce said $V_{TH}$ whereby said circuit is more susceptible to noise the improvement comprising: a third transistor coupled to said first transistor in a sense to add to said $V_{be}$ of said first transistor to raise said $V_{TH}$, said third transistor having its control terminal coupled to said diode means; pull out resistor means connected to said first transistor for pulling out said first transistor, current boost transistor means connected between said third transistor and a d.c. voltage source for providing a low impedance high current path for charging associated parasitic capacitances.

2. A circuit as in claim 1 where said first transistor has a base to emitter capacitance in part determined by said pull out resistor means said current boost transistor means charging such capacitance.

3. A circuit as in claim 1 where said third transistor is in a separate integrated circuit isolation tub from said input diode means and said current boost transistor means pulls up such tub toward said d.c. voltage source.

* * * * *